United States Patent [19]

Freeman et al.

[11] 4,053,873

[45] Oct. 11, 1977

[54] SELF-ISOLATING CROSS-COUPLED SENSE AMPLIFIER LATCH CIRCUIT

[75] Inventors: Leo Boyes Freeman; Robert James Incerto, both of Poughkeepsie; Joseph Anthony Petrosky, Jr., Wappingers Falls, all of N.Y.

[73] Assignee: International Business Machines Corporation, Armonk, N.Y.

[21] Appl. No.: 701,067

[22] Filed: June 30, 1976

[51] Int. Cl.$^2$ ............................................. G11C 11/40
[52] U.S. Cl. ................................. 340/173 R; 307/289
[58] Field of Search ..................... 340/173 R, 173 FF; 307/238, 289, 290, 291

[56] References Cited

U.S. PATENT DOCUMENTS

| | | | |
|---|---|---|---|
| 3,284,782 | 11/1966 | Burns | 340/173 R |
| 3,638,204 | 1/1972 | Kolankowsky | 340/173 R |

*Primary Examiner*—Terrell W. Fears
*Attorney, Agent, or Firm*—Theodore E. Galanthay

[57] ABSTRACT

Disclosed is a self-isolating cross-coupled sense amplifier latch circuit having five enhancement mode field effect transistor devices and two depletion mode field effect transistor devices. The first and second field effect transistors form a cross-coupled pair with true and complement outputs being available at the cross-coupled nodes. A third field effect transistor is connected to a common connection between the source electrodes of the cross-coupled pair and is used to establish a race condition after a small difference in potential has been applied to the aforementioned output nodes. A pair of depletion mode devices are connected as diodes between a positive potential (VH) and each of the output nodes, respectively. Each of the output nodes is connected to a respective bit line of a column of memory cells through enhancement mode field effect transistors connected as third and fourth unidirectionally conducting devices.

48 Claims, 4 Drawing Figures

SELF-ISOLATING CROSS-COUPLED SENSE AMPLIFIER LATCH CIRCUIT

CROSS-REFERENCE TO RELATED APPLICATIONS AND PATENTS

1. Sonoda U.S. Pat. No. 3,949,385 issued on Apr. 6, 1976, and assigned to the assignee of the present invention.
2. Freeman et al. application Ser. No. 583,926 filed on June 5, 1975, now U.S. Pat. No. 3,995,172 also assigned to the assignee of the present invention.
3. Palfi U.S. Pat. No. 3,610,967 issued on Oct. 5, 1971, and assigned to the assignee of the present invention.

BACKGROUND OF THE INVENTION

1. Field of the Invention

This invention relates to a sense amplifier latching circuit and more particularly to a sense amplifier latching circuit having self-isolation and fabricated from both depletion and enhancement mode field effect transistors.

2. Description of the Prior Art

The above-mentioned Sonoda patent exemplifies the prior art in memory arrays in which the present sense amplifier latch would be used. The above-mentioned Palfi patent is another example of a memory cell which could have its output sensed by the sense amplifier latching circuit of the present invention. The references cited in each of the foregoing two patents may also be referred to as being pertinent to the environment of the present invention. The prior art abounds with sense amplifiers, latches, and sense amplifier latch combinations for sensing the output of such memory cells. Generally, such memory cells have a pair of bit lines associated therewith for writing information into, and reading information out of such memory cells. Sense amplifiers are also connected to each of the pair of bit lines and typically detect a difference in either voltage or current (or both) on each of the pair of bit lines to determine whether a binary "0" or "1" was stored.

One type of such a sense amplifier is known to utilize a pair of cross-coupled field effect transistors and a third transistor used to establish a race condition between the cross coupled transistors after a difference in signal level has been impressed across the pair of bit lines. Once such sense amplifier is shown in U.S. Pat. No. 3,795,898, in which the cross coupled pair are transistors Q106 while the third transistor is identified as Q100, all in FIG. 1 of the Patent. A significant disadvantage of this last mentioned patented sense amplifier is that it is not isolated from the bit lines. Thus, after the race condition has been established and the sense amplifier latch is fully set, the bit lines have a full logic voltage difference impressed across them. Prior to the next memory cycle, it is necessary to restore the pair of bit lines to the same (binary up-level) potential, consuming time and power. One known technique for isolating the bit lines from such a cross-coupled sense amplifier latch is shown in U.S. Pat. No. 3,600,609. This last mentioned Patent, however, requires that the isolation transistors 14 and 16 be separately gated and further, cause the bit lines to be connected to the sense amplifier latch during the establishment of the race condition. Thus the bit lines will still be brought to a full logic level difference in potential.

As further background to the present invention, enhancement and depletion type field effect transistors have been used in previous circuit configurations as described in great detail in the cross referenced application by Freeman et al., the inventive entity of the present application. As was there particularly pointed out, the combination of the enhancement mode field effect transistors and the depletion mode field effect transistors as inverters was found to be superior to an inverter employing enhancement mode field effect transistors only, because the efficiency is higher and the transient response faster. The current through a depletion mode field effect transistor remains substantially constant as the output voltage transitions go toward the drain supply voltage, thus providing significantly greater switching speeds. The depletion field effect transistor can also be made significantly smaller than an enhancement mode field effect transistor used for the same purpose, particularly where switching speed is not required. Also, a depletion mode field effect transistor does not have the threshold voltage drop associated with enhancement mode field effect transistors so that when used as load devices, the output node between the signal transistor and the load device can be brought to a full binary up level. The aforementioned advantageous combination of depletion and enhancement mode field effect transistors in a self-isolated cross-coupled sense amplifier latched circuit were not known prior to the present invention.

SUMMARY OF THE INVENTION

It is accordingly an object of the present invention to provide an improved sense amplifier latching circuit using field effect transistors of both the enhancement and depletion mode.

It is another object of this invention to increase the speed of an electronic memory;

It is still another object of this invention to reduce power requirements in the operation of an electronic memory;

Lastly, it is an object of this invention to provide a sense amplifier latch designed for an integrated memory array in which there is no need to match the threshold voltage characteristics of the transistors in the sense amplifier latch.

In accordance with the present invention, a self-isolated, cross-coupled sense amplifier latching circuit comprising field effect transistors of both the enhancement and depletion mode is provided. Briefly, first and second cross-coupled field effect transistors have their source electrodes connected in common and to a third field effect transistor which establishes a race condition after a small potential difference has been applied to the cross-coupled electrodes. The small potential difference is applied through a pair of unidirectionally conducting devices which are connected between the input points and the cross-coupled electrodes. The direction of conduction of the unidirectionally conducting devices minimizes current flow between the input points and the cross-coupled electrodes thereby substantially isolating the input points from the cross-coupled electrodes.

During the start of a memory read cycle, the memory start (MS) line goes to 0 volts bringing the gate of transistor T3 below threshold, thereby turning it off. The output nodes A and B are charged through depletion devices T4 and T5. The output nodes are now balanced. As the cell is addressed, a small differential signal is established between the two bit lines (bit 0 and bit 1). This differential is translated to the output nodes through isolation devices T6 and T7. The MS terminal is now brought to a positive voltage VH causing T3 to conduct bringing the sources of cross-coupled transistors T1 and T2 near ground. The differential signal on the output nodes causes the circuit to switch due to the cross-coupled enhancement devices T1 and T2, to a voltage differential of approximately VH, at the output nodes A and B.

Enhancement devices T6 and T7 provide the self-isolating feature of the latch. During the race condition, as switching occurs, one of the output nodes is brought near 0 volts. Assuming that node A nears the 0 volts, then T6 stops conducting as it becomes reverse biased due to the higher potential of the associated bit line. This isolates that half of the latch from the bit line preventing the bit line from following the output voltage of the latch. This reduces the need to restore the bit line to its up potential as it is already near a full binary up level at the completion of the read cycle. The actual switching of the sense amplifier latch during the race condition is also speeded up by the use of depletion mode devices T4 and T5. Through a pair of isolated transistors T10 and T11, a push pull amplifier consisting of transistors T8 and T9 advantageously utilizes the output of the present sense amplifier latch.

The foregoing and other objects, features, and advantages of this invention will be apparent from the following and more detailed description of a preferred embodiment of the invention as illustrated in the accompanying drawings.

DESCRIPTION OF THE PREFERRED EMBODIMENTS

Figure 1:
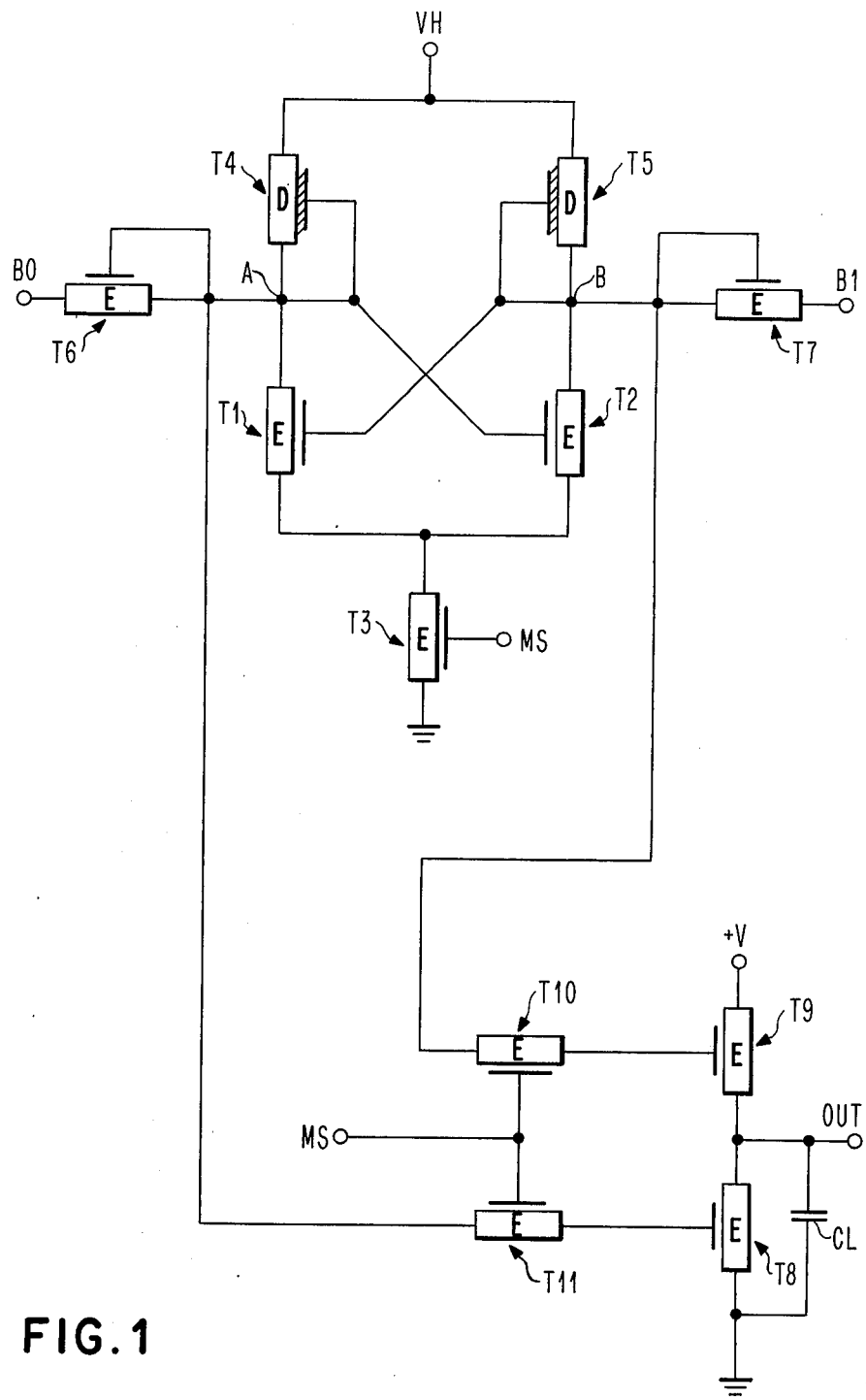
FIG. 1 is a schematic circuit diagram of the preferred embodiment of the present invention.

Refer now to FIG. 1 for a description of the circuit details. A pair of enhancement mode field effect transistors T1 and T2 have their source electrodes connected in common. The drain electrode of T1 is cross-coupled to the gate electrode of T2 while the drain electrode of T2 is cross-coupled to the gate electrode of T1. It is well known that drain and source electrodes of field effect transistors are controlled electrodes while the gate electrodes are generally control electrodes. The designation of drain and source is determined by the particular potential levels applied in use as field effect transistors are frequently constructed with structural symmetry. The FIG. 1 illustration shows field effect transistors of the n-channel type. Those skilled in the art would obviously recognize the dual of the disclosed circuit embodied in P-channel transistors with the potential sources and bias levels adjusted accordingly.

With continued reference to FIG. 1, T3 has its drain electrode connected to the common connection of the sources of T1 and T2 while the source electrode of T3 is connected to ground potential. The gate electrode of T3 is connected to a pulse source as will be described later herein. Transistor T4 is a depletion mode device having its drain electrode connected to the positive potential source VH and its source electrode, electrically in common with its gate electrode, connected to the drain of T1. Depletion mode transistor T5 has its drain electrode connected to the positive potential VH and its gate electrode in electrical common with its source electrode connected to the drain of T2. It is at this point noted that the output nodes of the sense amplifier latch are in electrical contact with the cross coupling connection of transistors T1 and T2 as well as the source to drain connection between T4 and T1 and T5 and T2. Thus, node A provides a first output point or node while node B provides a second output point or node. Enhancement mode transistor T6 has its source connected to an input point or node also identified as bit line B0 and its gate electrode in common with its drain electrode connected to node A. Enhancement mode transistor T7 has its source electrode connected to a second input node or point also identified as bit line B1 while its drain and gate electrodes are in electrical common and connected to node B.

An advantageous means for further processing the output of the just described sense amplifier latching circuit is the utilization of a push pull amplifier. Such a push pull amplifier consists of an enhancement mode device T9 having its drain electrode connected to a positive potential such as +V. It is noted that +V may be equal to the positive potential VH. The source electrode of T9 is connected to the drain electrode of transistor T8 while the source electrode of enhancement mode transistor T8 is connected to ground potential. The gate electrode of T9 is electrically coupled to node B while the gate electrode of T8 is electrically coupled to node A. An output is taken from the common point between the source of T9 and the drain of T8 and would typically drive a capacitive load as designated by the capacitor (CL).

Transistors T10 and T11 are isolation means between the output nodes and the push pull amplifier. T10 and T11 are field effect transistors having their drain to source paths connected in the series electrical path between the output points of the sense amplifier latch and the input points of the push pull amplifier. The gating electrodes of T10 and T11 are connected to each other and are adapted to receive the same gating pulse MS as is supplied to transistor T3. The purpose of the isolation means is to block the output of the sense amplifier latch and at all times when both output nodes A and B are at an up level. At all other times, the output nodes A and B can have a direct electrical connection to the inputs of the push pull amplifier.

Figure 2:
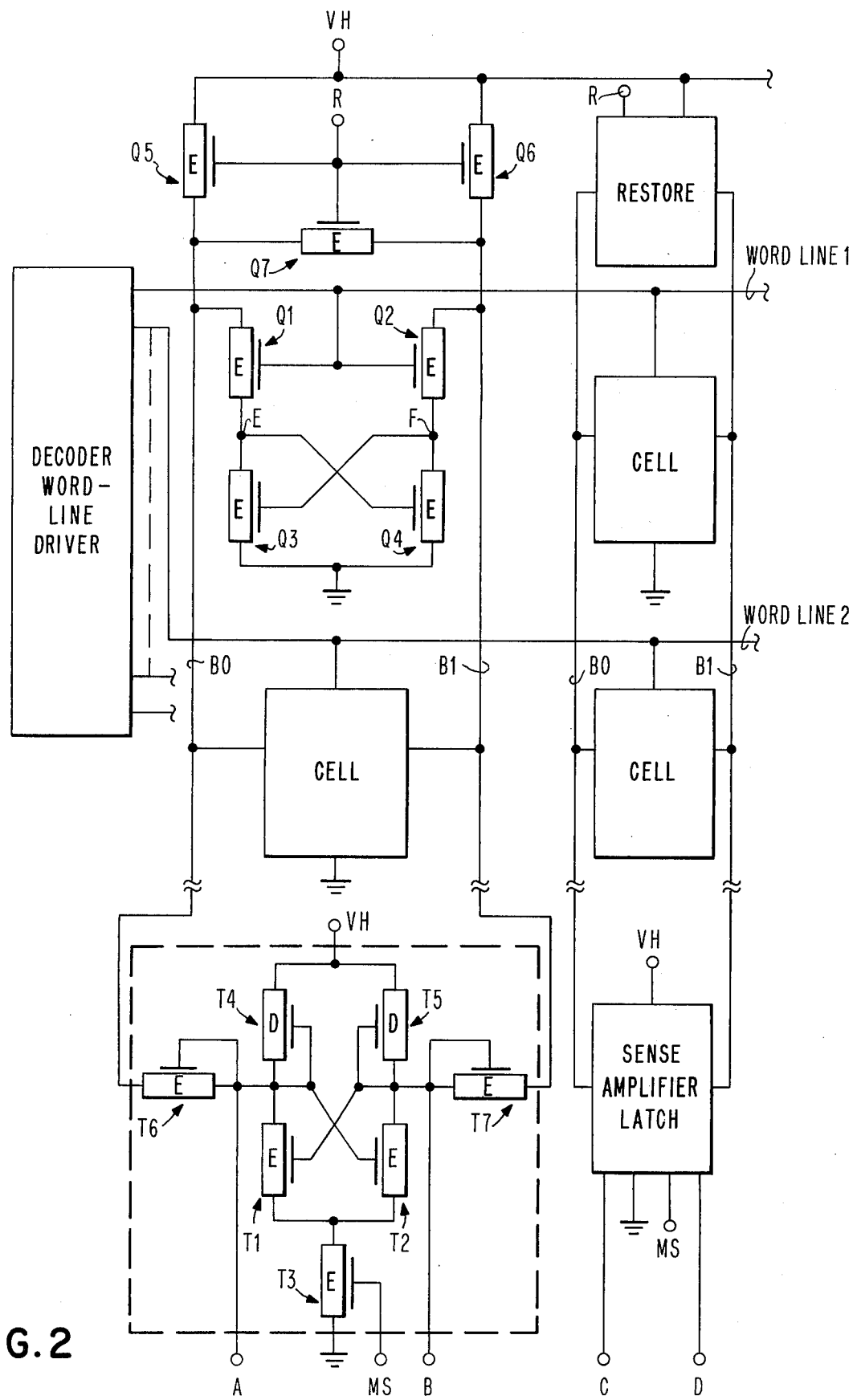
FIG. 2 is a schematic circuit diagram illustrating the present invention in an overall memory array.

Refer now to FIG. 2 which illustrates the present sense amplifier latch circuit connected in an exemplary electronic memory system. A matrix of four cells is shown for purposes of illustration. A typical cell includes four field effect transistors such as Q1, Q2, Q3 and Q4. The present invention, could of course be used also with six device and other memory cells of the type having two bit lines for every column of cells. Typically, a decoder wordline driver is connected to each row of cells such as the word lines 1 and 2 as illustrated. A restoring means for equalizing or precharging the bit lines consists of transistors Q5, Q6 and Q7. The gate electrodes of each of said transistors is connected together and adapted to receive a restore pulse signal R on terminal R. The gated electrodes of Q7 are connected in series between the two bit lines providing equalization of potential. Transistors Q5 and Q6 are connected in a series path with each other between the two bit lines and receive a positive potential VH at a common point between them for application equally to the two bit lines. As will be appreciated more fully herein, one of the salient features of the present invention is the ability to limit the duration of the pulse at terminal R because neither bit line B0 or B1 is ever discharged to a full logic level because of the self-isolation feature of devices T6 and T7. This minimal bit line swing results in overall high speed operation.

As previously mentioned, it is not necessary to have a separate sense amplifier latch for every column of cells. This alternative is illustrated in the FIG. 4 embodiment. Corresponding items to previously described FIG. 2 have been numbered with the same reference numbers insofar as practical but with a "prime" notation. The difference resides in the bit switches and decode circuits (so identified) which permit the same sense amplifier latch to detect a selected one of a plurality of column lines.

OPERATION

Figure 3:
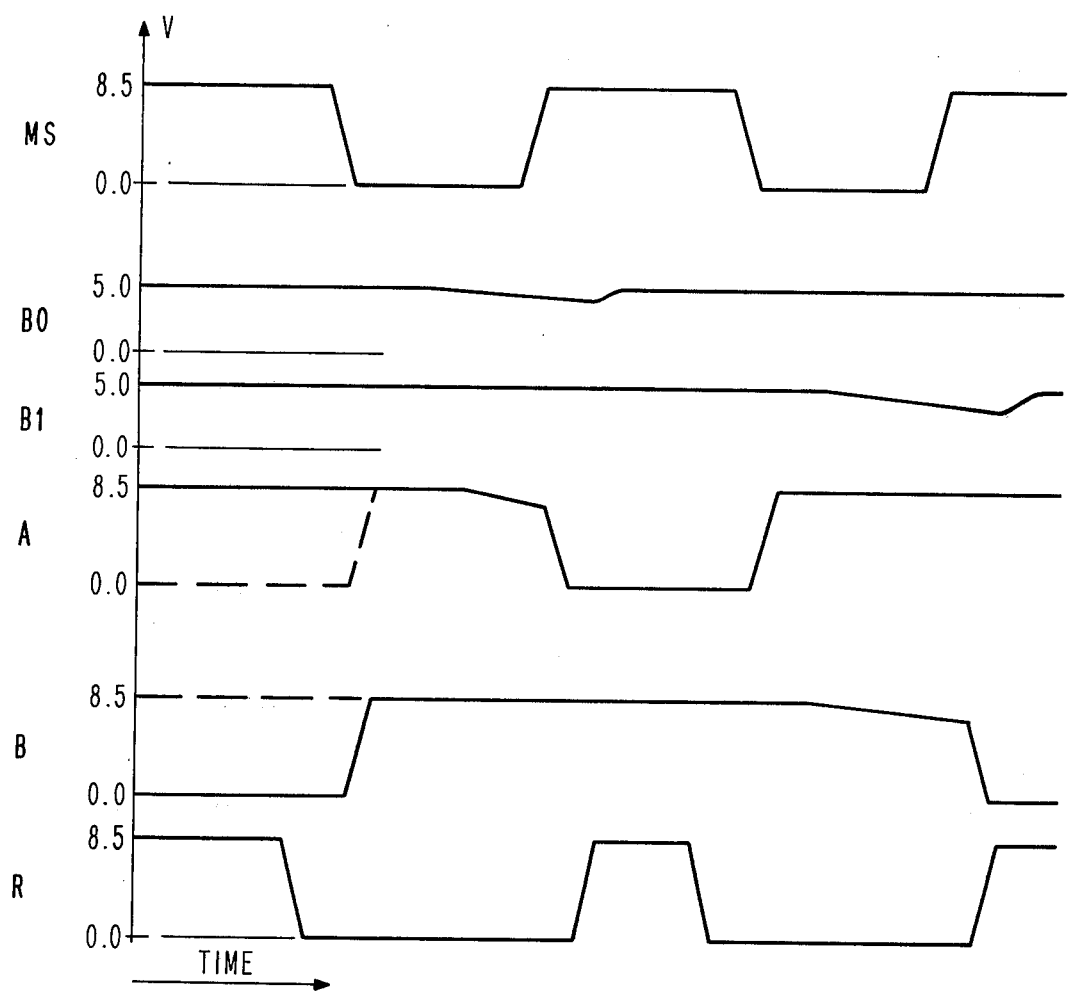
FIG. 3 is a series of waveform diagrams depicting the operation of the circuits of FIG. 1 and FIG. 2.

In operation, the memory array of FIG. 2, operates in its conventional and well known manner, except for the improved speed and lower power consumption provided by the sense amplifier latch of the present invention. With continued reference to FIGS. 1, 2, and 4, refer also to FIG. 3 which illustrates waveform diagrams depicting the operation of the present invention. Exemplary voltage values have been inserted on the various waveforms and are intended to be exemplary rather than limiting.

At the initial point of time in the waveform diagrams, the memory select pulse (MS) is at an up level from the previous cycle as are the bit lines B0 and B1. Nodes A and B are a full logic level apart, their binary voltage relationship depending on whether the previously stored bit was a logical "1" or "0". At this point in time, transistors T10 and T11 are on, providing an input to the push pull amplifier, which in turn provides, as an output, the previously stored bit. The restore pulse R is at a logical up level and the bit lines B0 and B1 are precharged to their up level. It is here noted that the terms charging and discharging are relative terms depending on the polarity of the impressed potential levels and the channel type of the field effect transistors.

As depicted in the waveform diagram, the memory select (MS) waveform is initially brought to a down level turning transistor T3 off. This causes the common connection between the source of T1 and T2 and the drain of T3 to charge to an up level through the "on" one of transistors T1 and T2 and its associated load device T4 or T5. Node A will charge to a full up level through depletion mode device T4 and will be at the same potential as VH (designated as 8.5 volts in the waveform diagram). Similarly, node B will charge to 8.5 volts through depletion mode transistor T5. Transistors T10 and T11 are turned off, preventing a DC current path through the push pull amplifier. The common connection between the source of transistor T1 and the source of transistor T2 and the drain of transistor T3 will be one threshold drop below VH based on the well known characteristic of enhancement mode field effect transistors. The bit lines will be at approximately one threshold drop below nodes A and B and have been designated as 5 volts in the waveform diagram.

The occurrence of the memory start (MS) waveform going down is utilized to address a particular row of cells causing one of the bit lines to be pulled down by the memory cell. As can be seen by referring to FIG. 2, as the gate of Q1 and Q2 is brought to an up level turning Q1 and Q2 on, the voltage difference at nodes E and F will be transferred to the corresponding bit lines B0 and B1. Consider first the case where bit line 0 (B0) begins to drop at this point in time. Current will be drawn from node A into bit line 0 through enhancement mode device T6 thereby lowering the potential of node A slightly below that of node B. At this point in time, the memory start (MS) is brought to an up level turning transistor T3 on and bringing the common connection between the source of electrodes of T1 and T2 and the drain electrode of T3 to ground potential.

This initiates the "race". Node A being at a lower potential than node B causes T2 to be slightly less conductive than T1. T1 being more conductive brings node A down faster causing T2 to turn off harder until T2 is fully off due to node A having been brought to ground potential. At this point in time, T6 which is a unidirectionally conducting device, is reverse biased so that no current is being drawn out of bit line B0. With the latch fully set the output is available as a full logic output level at either or both of nodes A, B, as well as nodes C, D, etc. on the additional column lines. Thus, the restore pulse may be brought to an up level equalizing the two bit lines at their up level of +5 volts. The time and power required to restore the bit line B0 from its slight negative going transition is much faster and consumes far less power than if it had been brought to a full logic down level.

Once the bit lines have been restored, the restore pulse may be brought down as well as the MS pulse being brought down so that the next bit may be read from the memory. In the second case assume that the bit line B1 has a slight negative going transition. As the MS pulse goes up turning T3 on, the race condition causes node B to be brought down while node A remains at an up level. The unidirectionally conducting device T7 prevents current from being drawn out of bit line B1 and another relatively short restore pulse can be used to equalize the bit line for the next read cycle.

The output is typically supplied to push pull amplifier consisting of the series connected transistors T8 and T9 when the MS pulse has turned T10 and T11 on and nodes A and B are a full logic level apart. In the case where node A is down and node B is up, the capacitor CL is charged to an up level because T9 is turned on while T8 is turned off. Conversely, if node A is at an up level while node B is at a down level, then the output will be brought to ground and the capacitor CL is discharged to a down level.

In addition to improving the speed of the overall operation by minimizing the duration of the restore pulse as well as permitting the restore pulse to come on at an early point in time, the present sense amplifier latch has enhanced speed because of the use of the depletion mode devices T4 and T5. Depletion mode devices T4 and T5 provide a full voltage swing and there is not need to match their threshold voltage. Due to the constant gate to source bias, they act as a current source and enhance the switching speed of the present circuit in the same manner as in inverter circuits in which depletion mode devices are used as load devices.

As previously pointed out, the minimal bit line swing saves on power during the recharging of the bit lines to their full up potential. Power is also saved by the sense amplifier latch circuit itself since trasistor T3 is only on approximately one-half of the time. Thus, no DC current flows in the sense amplifier latch circuit between VH and ground when transistor T3 is off.

Figure 4:
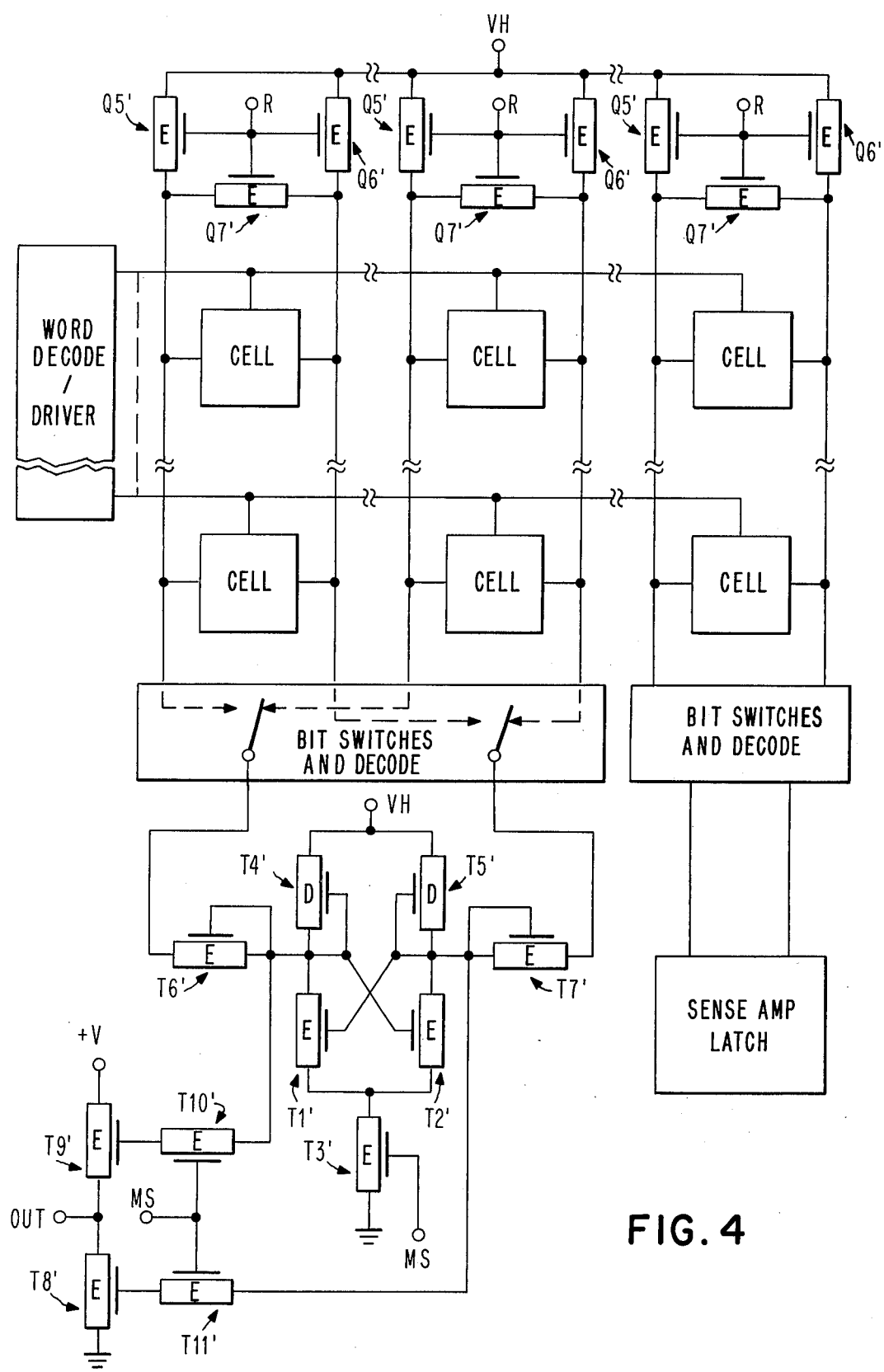
FIG. 4 is a schematic circuit diagram illustrating an alternate embodiment of a memory array incorporating the present invention.

Although an output from both nodes A and B to a push-pull amplifier has been shown, it is obviously that an output from either node A or node B would also provide the binary information stored in the memory cell. It is further noted that a separate sense amplifier latch has been illustrated for every column of cells. With the present sense amplifier latch, it would be possible to have a decoding network in which only the same number of sense amplifier latches as the number of bits needed to be read at any one time would have to be used, as illustrated in FIG. 4. Thus, in a memory consisting of 80 columns, if only five bits were desired to be read at any one time, then only five sense amplifier latches with suitable gating of the various bit lines would be required.

While the invention has been shown and particularly described with reference to the preferred embodiment, it will be understood by those skilled in the art that various changes in form and detail may be claimed therein without departing from the spirit and the scope of the invention.

What is claimed is:

1. In an electronic memory system, a sense amplifier latching circuit comprising:
   first and second sources of potential;
   first and second input nodes;
   first and second output nodes;
   first and second transistors, each having first and second controlled electrodes and a control electrode, said first controlled electrodes being electrically connected, said second controlled electrode of said first transistor being electrically connected to the control electrode of said second transistor, said second controlled electrode of said second transistor being electrically connected to the control electrode of said first transistor;
   said first output node being in electrical contact with said electrical connection between the second controlled electrode of said first transistor and the control electrode of said second transistor;
   said second output node being in electrical contact with said electrical connection between said second controlled electrode of said second transistor and the control electrode of said first transistor;
   a first unidirectionally conducting means electrically connected between said first source of potential and said first output node;
   a second unidirectionally conducting means electrically connected between said first source of potential and said second output node;
   a third unidirectionally conducting means electrically connected between said first input node and said first output node;
   a fourth unidirectionally conducting means electrically connected between said second input node and said second output node; and
   a third transistor having first and second controlled electrodes and a control electrode, the first controlled electrode of said third transistor being electrically connected to said second source of potential, the second controlled electrode of said third transistor being in electrical contact with said electrical connection between the first controlled electrodes of said first and second transistors, the control electrodes of said third transistor being electrically connected to a third source of potential.

2. A sense amplifier latching circuit as in claim 1 wherein said third source of potential is a variable source of potential.

3. A sense amplifier latching circuit as in claim 2 wherein said variable source of potential has two stable states.

4. A sense amplifier latching circuit as in claim 3 wherein said first and second sources of potential are fixed sources of potential.

5. A sense amplifier latching circuit as in claim 4 wherein a first one of the two stable states of said third source of potential approximates in value that of said first fixed source of potential while the second of the two stable states of said third source of potential approximates in value that of the second fixed source of potential.

6. A sense amplifier latching circuit as in claim 3 wherein the first stable state of said third source of potential biases said third transistor into its low impedance state, the second of said two stable states biasing said third transistor into its high impedance state.

7. A sense amplifier latching circuit as in claim 6 wherein a potential difference is applied to said first and second input nodes at a time when said third transistor is in its high impedance state.

8. A sense amplifier latching circuit as in claim 7 wherein said input signal causes one of said third and fourth unidirectionally conducting means to conduct thereby establishing a potential difference on the control electrodes of said first and second transistors such that when said third transistor is placed in its low impedance state, one of said first and second transistors conducts more current than the other until one of said first and second transistors is turned off and a potential difference between said first and second output nodes is established, said potential difference being approximately equal to the potential difference between said first and second fixed sources of potential.

9. A sense amplifier latching circuit as in claim 8 wherein said first and second input nodes are at a substantially equal potential level approximately equal to the value of the potential level of said first fixed source of potential prior to the application of an input signal.

10. A sense amplifier latching circuit as in claim 1 further comprising:
    a push pull amplifier having first and second input nodes, the first input node of said push pull amplifier being electrically coupled to the first output node, the second input node of said differential amplifier being electrically coupled to the second output node.

11. A sense amplifier latching circuit as in claim 1 wherein said first, second, and third transistors are field effect transistors.

12. A sense amplifier latching circuit as in claim 11 wherein said field effect transistors are enhancement mode field effect transistors.

13. A sense amplifier latching circuit as in claim 1 wherein said first and second unidirectionally conducting means comprise fourth and fifth field effect transistors, respectively, each having first and second controlled electrodes and a control electrode, said first controlled electrodes being electrically connected to said first source of potential, said second controlled electrode of said fourth field effect transistor being electrically connected to said first output node, said second controlled electrode of said fifth field effect transistor being electrically connected to said second output node.

14. A sense amplifier latching circuit as in claim 13 wherein said fourth and fifth field effect transistors are of the depletion mode type each having its control electrode electrically connected to its second controlled electrode, respectively.

15. A sense amplifier latching circuit as in claim 1 wherein said third and fourth unidirectionally conducting means comprise sixth and seventh field effect transistors each having first and second controlled electrodes and a control electrode.

16. A sense amplifier latching circuit as in claim 15 wherein said sixth and seventh field effect transistors are of the enhancement type each having an electrical connection between its second controlled electrode and its control electrode, respectively, said sixth field effect transistor having its first controlled electrode electrically connected to said first input node, said seventh field effect transistor having its first controlled electrode electrically connected to said second input node.

17. An array of semiconductor memory cells formed in a semiconductor substrate, said array comprising:
a plurality of word lines arranged in parallel with each other each connected to a plurality of said cells arranged in a row;
a plurality of bit lines, parallel to each other, arranged orthogonally to said word lines, a pair of said bit lines being operatively associated with each cell in a column of cells;
a sense amplifier latching circuit as in claim 1 having its first input node electrically connected to a first one of said pair of said bit lines, and second input node connected to a second one of said pair of said bit lines.

18. An array of semiconductor memory cells as in claim 17 further comprising:
means for bringing said first and second ones of said pair of bit lines to a potential level approximately equal to the potential of said first source of potential, said third and fourth unidirectionally conducting means being arranged to minimize current flow between said first and second bit lines and said first and second output nodes.

19. An array of semiconductor memory cells as in claim 18 further comprising:
a push pull amplifier having first and second input nodes, the first input node of said push pull amplifier being electrically coupled to the first output node, the second input node of said differential amplifier being electrically coupled to the second input node.

20. An improved circuit comprising:
first and second field effect transistors each having source, drain, and gate electrodes, said source electrodes being electrically connected, said drain electrode of said first field effect transistor being electrically connected to the gate electrode of said second field effect transistor, said drain electrode of said second field effect transistor being electrically connected to the gate electrode of said first field effect transistor;
a third field effect transistor having a source, drain and gate electrode, the drain electrode of said third field effect transistor being electrically connected to said electrical connection between source electrodes of said first and second field effect transistors, the gate electrode of said third field effect transistor being electrically connected to a pulsating source of potential;
a fourth field effect transistor having a source, drain and gate electrode, having its drain electrode electrically connected to a first fixed source of potential, its gate and source electrodes being electrically coupled to each other and to the connection between the drain electrode of said first field effect transistor and the gate electrode of said second field effect transistor thereby providing a first output point;
a fifth field effect transistor having a source, drain, and gate electrode, said drain electrode being electrically connected to said first fixed source of potential, the gate and source electrodes being electrically coupled to each other and to the electrical connection between the drain electrode of said second field effect transistor and the gate electrode of said first field effect transistor thereby providing a second output point;
a sixth field effect transistor having a drain, source and gate electrodes, having its drain and gate electrodes coupled to each other and to said first output point, its source electrode being electrically connected to a first input point;
a seventh field effect transistor having a drain, source and gate electrode, having its drain and gate electrodes coupled to each other and to said second output point, the source electrode of said seventh field effect transistor being coupled to a second input point; and
the source electrode of said third field effect transistor being coupled to a second fixed source of potential.

21. An improved circuit as in claim 20 wherein said field effect transistors are of the N-channel type.

22. An improved circuit as in claim 21 wherein said first, second, third, sixth, and seventh field effect transistors are enhancement mode while said fourth and fifth field effect transistors are depletion mode.

23. An improved circuit as in claim 22 wherein said first fixed source of potential is positive relative to said second fixed source of potential and said pulsating source of potential has two stable states each of said stable states being approximately equal in potential level to one of said first and second fixed sources of potential.

24. An improved circuit as in claim 23 further comprising:
means for bringing said first and second input points to a potential level approximately equal to the potential level of said first fixed source of potential, said fourth and fifth field effect transistors bringing said first and second output points to a potential level approximately equal to the potential level of said first fixed source of potential, such that when either input point receives a potential level less than that of said first fixed source of potential, the corresponding one of said sixth and seventh field effect transitors conduct thereby conditioning one of said first and second field effect transistors to a lesser gate to source bias level than the other, such that when said third field effect transistor is caused to conduct, the first and second output nodes are brought to approximately the same potential difference as exists between said first and second fixed sources of potential, without additional current flow through either one of said sixth and seventh field effect transistors.

25. An improved circuit as in claim 20 further comprising:
a push pull amplifier having first and second input nodes, the first input node of said push pull amplifier being electrically coupled to the first output point, the second input node of said differential amplifier being electrically coupled to the second output point.

26. An improved circuit as in claim 20 further comprising:
means for bringing said first and second input points to a potential level approximately equal to the potential level of said first fixed source of potential, said fourth and fifth field effect transistors bringing said first and second output points to a potential level approximately equal to the potential level of said first fixed source of potential, such that when either input point receives a potential level less than that of said first fixed source of potential, the corresponding one of said sixth and seventh field effect transistors conduct thereby conditioning one of said first and second field effect transistors to a lesser gate to source bias level than the other such that when said third field effect transistor is caused to conduct, the first and second output nodes are brought to approximately the same potential difference as exists between said first and second fixed sources of potential, without additional current flow through either one of said sixth and seventh field effect transistors.

27. An improved circuit as in claim 25 further comprising:
an eighth field effect transistor having a drain, source and gate electrode and having its drain to source path connected between the first input node of said push pull amplifier and the first output point;
a ninth field effect transistor having a drain, source and gate electrode, having its drain to source path coupled between the second input node of said differential amplifier and said second output point; and
the gate electrodes of said eighth and ninth field effect transistors being coupled to each other and to a second pulsating source of potential.

28. An array of semiconductor memory cells as in claim 19 further comprising:
an eighth field effect transistor having a drain, source and gate electrode and having its drain to source path connected between the first input node of said push pull amplifier and the first output point;
a ninth field effect transistor having a drain, source and gate electrode, having its drain to source path coupled between the second input node of said differential amplifier and said second output point; and
the gate electrodes of said eighth and ninth field effect transistors being coupled to each other and to a pulsating source of potential.

29. An array of semiconductor memory cells as in claim 17 further comprising:
means connected between said plurality of bit lines and said sense amplifier latching circuit adapted to selectively connect one of a plurality of said pair of said bit lines to a selected one of said sense amplifier latching circuits.

30. In an electronic memory system, a sense amplifier latching circuit comprising:
first and second sources of potential;
first and second input nodes;
first and second output nodes;
first and second transistors, each having first and second controlled electrodes and a control electrodes, said first controlled electrodes being electrically connected, said second controlled electrode of said first transistor being electrically connected to the control electrode of said second transistor, said second controlled electrode of said second transistor being electrically connected to the control electrode of said first transistor;
said first output node being in electrical contact with said electrical connection between the second controlled electrode of said first transistor and the control electrode of said second transistor;
said second output node being in electrical contact with said electrical connection between said second controlled electrode of said second transistor and the control electrode of said first transistor;
a first impedance means electrically connected between said first source of potential and said first output node;
a second impedance means electrically connected between said first source of potential and said second output node;
a first isolation means electrically connected between said first input node and said first output node;
a second isolation means electrically connected between said second input node and said second output node; and
a third transistor having first and second controlled electrodes and a control electrode, the first controlled electrode of said third transistor being electrically connected to said second source of potential, the second controlled electrode of said third transistor being in electrical contact with said electrical connection between the first controlled electrodes of said first and second transistors, the control electrode of said third transistor being electrically connected to a third source of potential.

31. A sense amplifier latching circuit as in claim 30 wherein said third source of potential is a variable source of potential.

32. A sense amplifier latching circuit as in claim 31 wherein said variable source of potential has two stable states.

33. A sense amplifier latching circuit as inclaim 32 wherein said first and second sources of potential are fixed sources of potential.

34. A sense amplifier latching circuit as in claim 33 wherein a first one of the two stable states of said third source of potential approximates in value that of said first fixed source of potential while the second of the two stable states of said third source of potential approximates in value that of the second fixed source of potential.

35. A sense amplifier latching circuit as in claim 32 wherein the first stable state of said third source of potential biases said third transistor into its low impedance state, the second of said two stable states biasing said third transistor into its high impedance state.

36. A sense amplifier latching circuit as in claim 35 wherein a potential difference is applied to said first and second input nodes at a time when said third transistor is in its high impedance state.

37. A sense amplifier latching circuit as in claim 36 wherein said input signal causes one of said first and second isolation means to conduct thereby establishing a potential difference on the control electrodes of said first and second transistors such that when said third transistor is placed in its low impedance state, one of said first and second transistors conducts more current than the other until one of said first and second transistors is turned off and a potential difference between said first and second output nodes is established, said potential difference being approximately equal to the potential difference between said first and second fixed sources of potential.

38. A sense amplifier latching circuit as in claim 37 wherein said first and second input nodes are at a substantially equal potential level approximately equal to the value of the potential level of said first fixed source of potential prior to the application of an input signal.

39. A sense amplifier latching circuit as in claim 30 further comprising:
a push pull amplifier having first and second input nodes, the first input node of said push pull amplifier being electrically coupled to the first output node, the second input node of said differential amplifier being electrically coupled to the second output node.

40. A sense amplifier latching circuit as in claim 30 wherein said first, second, and third transistors are field effect transistors.

41. A sense amplifier latching circuit as in claim 40 wherein said field effect transistors are enhancement mode field effect transistors.

42. A sense amplifier latching circuit as in claim 30 wherein said first and second impedance means comprise fourth and fifth field effect transistos, respectively, each having first and second controlled electrodes and a control electrode, said first controlled electrodes being electrically connected to said first source of potential, said second controlled electrode of said fourth field effect transistor being electrically connected to said first output node, said second controlled electrode of said fifth field effect transistor being electrically connected to said second output node.

43. A sense amplifier latching circuit as in claim 42 wherein said fourth and fifth field effect transistors are of the depletion mode type each having its control electrode electrically connected to its second controlled electrode, respectively.

44. A sense amplifier latching circuit as in claim 30 wherein said first and second isolation means comprise sixth and seventh field effect transistors each having first and second controlled electrodes and a control electrodes.

45. A sense amplifier latching circuit as in claim 44 wherein said sixth and seventh field effect transistors are of the enhancement type each having an electrical connection between its second controlled electrode and its control electrode, respectively, said sixth field effect transistor having its first controlled electrode electrically connected to said first input node, said seventh field effect transistor having its first controlled electrode electrically connected to said second input node.

46. An array of semiconductor memory cells formed in a semiconductor substrate, said array comprising:
a plurality of word lines arranged in parallel with each other each connected to a plurality of said cells arranged in a row;
a plurality of bit lines, parallel to each other, arranged orthogonally to said word lines, a pair of said bit lines being operatively associated with each cell in a column of cells;
a sense amplifier latching circuit as in claim 30 having its first input node electrically connected to a first one of said pair of said bit lines, said second input node connected to a second one of said pair of said bit lines.

47. An array of semiconductor memory cells as in claim 46 further comprising:
means for bringing said first and second ones of said pair of bit lines to a potential level approximately equal to the potential of said first source of potential, said first and second isolation means being arranged to minimize current flow between said first and second bit lines and said first and second output nodes.

48. An array of semiconductor memory cells as in claim 47 further comprising:
a push pull amplifier having first and second input nodes, the first input node of said push pull amplifier being electrically coupled to the first output node, the second input node of said differential amplifier being electrically coupled to the second input node.

* * * * *